US005910745A

United States Patent [19]

Zarabadi

[11] Patent Number: 5,910,745

[45] Date of Patent: Jun. 8, 1999

[54] PROCESS PARAMETERS AND TEMPERATURE INSENSITIVE ANALOG DIVIDER/MULTIPLIER/RATIOMETRY CIRCUIT

[75] Inventor: Seyed Ramezan Zarabadi, Kokomo, Ind.

[73] Assignee: Delco Electronics Corporation, Kokomo, Ind.

[21] Appl. No.: 08/846,455

[22] Filed: May 1, 1997

[51] Int. Cl.$^{6}$ ..................................................... H03K 17/92

[52] U.S. Cl. .......................... 327/356; 327/358; 327/359; 327/378; 327/513; 327/561; 327/563

[58] Field of Search .................................... 327/356, 358, 327/359, 378, 513, 561, 563

[56] References Cited

U.S. PATENT DOCUMENTS 4,100,432 7/1978 Miyakawa et al. ..................... 327/359

OTHER PUBLICATIONS

Zarabadi, Seyed R. et al. "An Angular Rate Sensor Interface IC," IEEE 1996 Custom Integrated Circuits Conference, pp. 14.6.1–15.6.4.

*Primary Examiner*—Margaret R. Wambach
*Attorney, Agent, or Firm*—Jimmy L. Funke

[57] ABSTRACT

A CMOS analog divider/multiplier/ratiometry circuit that provides a ratiometric output of two or more inputs, where the output is insensitive to process parameters and temperature variations effecting the circuit. The analog divider/multiplier/ratiometry circuit includes a multiplier portion made up of six FET devices. The six FET devices are electrically connected together so that first and second current outputs from the multiplier portion are insensitive to process parameter and temperature variations effecting the circuit. A first input current is applied to a gate terminal of one of the FET devices and a second input current is applied to a gate terminal of the FET devices in the multiplier portion of the circuit. The first and second input currents are based on currents generated by first and second linear voltage-to-current converter input circuits that are responsive to first and second input voltage, respectively, whose ratio or product is to be determined at the output of the circuit. The output currents from the multiplier portion are applied to a difference amplifier that generates the ratio/product output.

21 Claims, 7 Drawing Sheets

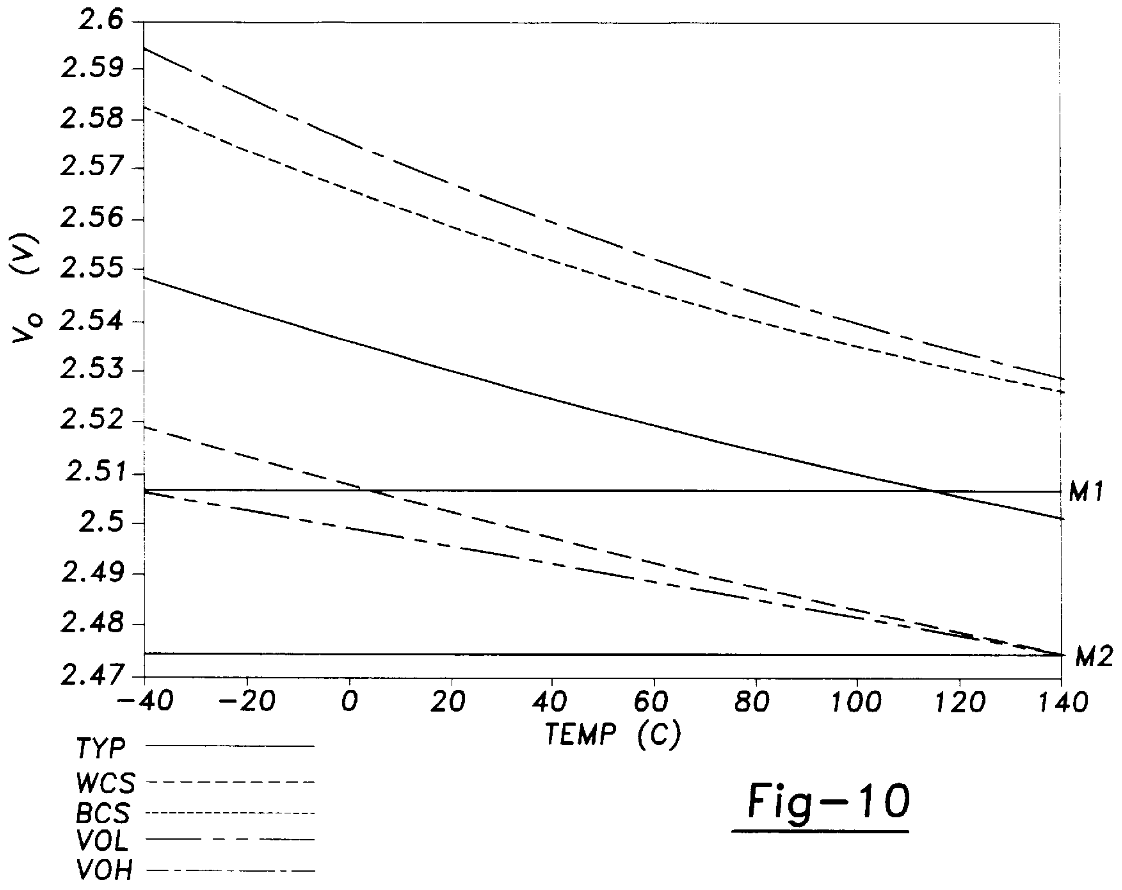
Fig−10
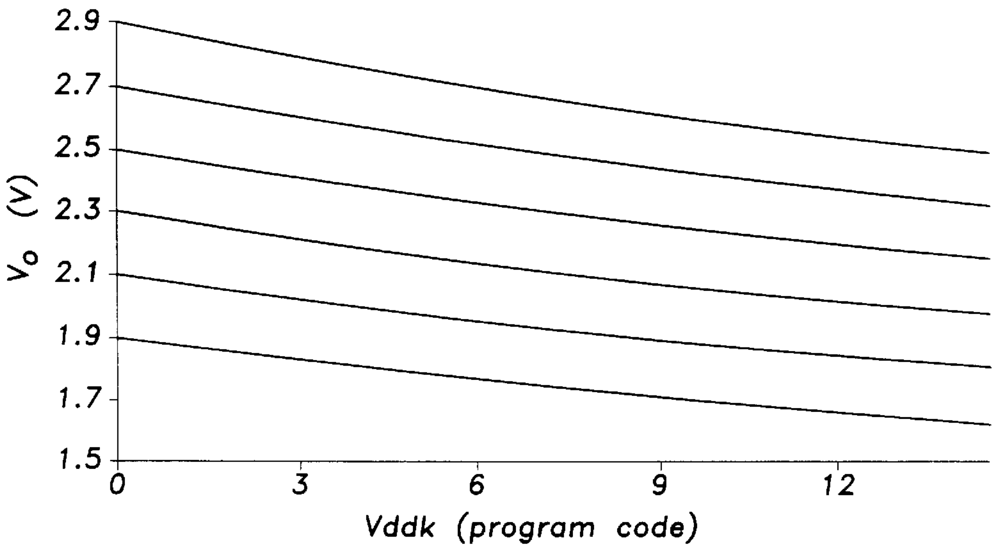
Fig−11

PROCESS PARAMETERS AND TEMPERATURE INSENSITIVE ANALOG DIVIDER/MULTIPLIER/RATIOMETRY CIRCUIT

BACKGROUND OF THE INVENTION

1. Field of the Invention

This invention relates generally to a multiplier circuit for generating a ratio or product of two or more input signals and, more particularly, to a CMOS sensor circuit that acts as an analog divider, multiplier and ratiometry circuit to provide a ratiometric output signal that is insensitive to process parameters and temperature variations on the circuit.

2. Discussion of the Related Art

Consumer demand for improved vehicle safety has caused several vehicle manufacturers to develop vehicle yaw rate control systems. The yaw rate for a vehicle is the angular rate of rotation about a vehicle's vertical axis. In other words, it is a measure of the turning of the vehicle to the left or to the right. A vehicle yaw rate control system compares the driver's desired turning rate to the actual turning rate of the vehicle, and provides a continuous feedback to maintain the vehicle directed towards the driver's desired heading. For example, if the right drive tire of the vehicle is on ice and the left drive tire is on asphalt, the vehicle will tend to rotate (yaw) towards the right even though the driver is attempting to maintain the steering of the vehicle in a forward direction. Thus, the control system would provide control signals to adjust wheel torque for the appropriate wheel or wheels to maintain the desired steering direction. The system would include a steering wheel angle sensor that provides a signal indicating the driver's desired turning rate, and a yaw rate sensor to measure the actual turning rate of the vehicle. The two input signals, as well as lateral acceleration, are used by the yaw rate control system to determine whether the vehicle is heading in the direction that the driver desires. An example of a yaw rate control system is described in Zarabadi, Seyed R. et al., "An Angular Rate Sensor Interface IC," IEEE 1996 Custom Integrated Circuits Conference, May, 1996, pp. 311–314.

In certain sensor systems, such as a vehicle yaw rate sensor system, it is necessary to provide a circuit that produces an output signal which is the ratio or product of the system's main power supply voltage and a temperature voltage signal from a temperature compensation circuit. When the circuit multiplies the power supply signal and the temperature voltage signal, its output is used as a reference to a closed amplitude loop to produce another output signal to provide a system output which is ratiometric to the power supply voltage, while canceling the sensor temperature sensitivity. If a circuit exhibits temperature, fabrication and component variance sensitivities, then some sort of calibration and trimming have to be incorporated to cancel these sensitivities over the life of the product. Calibration and trimming are expensive because they require a high equipment investment and significantly increase the product's test cost.

There are many known designs of metal oxide semiconductor (MOS) divider/multiplier/ratiometry circuits. A voltage divider/multiplier/ratiometry circuit is a versatile circuit that is used to generate a ratio/product of two or more signals. All of the known MOS circuits either do not implement an exact function or exhibit temperature and process sensitivity. The only multiplier known which implements the exact function and yet is insensitive to temperature and process variations is the well known bipolar Gilbert multiplier. The Gilbert multiplier is based on the translinear principle, and is widely used in many types of discrete multipliers. However, because the Gilbert multiplier uses bipolar devices which do not lend themselves to inexpensive standard high density CMOS processes, Gilbert Multipliers have disadvantages and are not practical for certain applications, such as yaw rate control system in a vehicle.

What is needed is an MOS divider/multiplier/ratiometry circuit that is insensitive to process parameters and temperature changes, and can be implemented in a yaw rate control system. It is therefore an object of the present invention to provide such a circuit.

SUMMARY OF THE INVENTION

In accordance with the teachings of the present invention, a CMOS analog divider/multiplier/ratiometry circuit is disclosed that provides a ratiometric output of two or more inputs, where the output is insensitive to process parameters and temperature variations effecting the circuit. In a first embodiment, the analog divider/multiplier/ratiometry circuit includes a multiplier portion made up of six FET devices. The six FET devices are electrically connected together such that first and second current outputs from the multiplier portion provides an output voltage that is insensitive to process parameter and temperature variations. A first input current is applied to a gate terminal of one of the FET devices and a second input current is applied to a gate terminal of another of the FET devices in the multiplier portion of the circuit. The first and second input currents are based on currents generated by first and second linear voltage-to-current converter input circuits that are responsive to first and second input voltages, respectively, whose ratio or product is to be determined at the output of the circuit. The output currents from the multiplier portion are applied to a difference amplifier that generates the ratiometric or product output.

In a second embodiment, the multiplier portion is made up of sixteen FET devices that are electrically connected to provide output currents applied to a difference amplifier that generates an output voltage that is also invariant to process parameter and temperature variances.

Additional objects, advantages, and features of the present invention will become apparent from the following description and appended claims, taken in conjunction with the accompanying drawings.

BRIEF DESCRIPTION OF THE DRAWINGS

FIG. 10 is a graph of output drift with temperature for the circuit shown in FIG. 4, where $V_0$ is on the vertical axis and temperature is on the horizontal axis, for each of a typical case, worst case scenario, best case scenario, and process parameter variable low and high cases; and FIG. 11 is a graph of measured output signals for the circuit of FIG. 4 for program codes.

DETAILED DESCRIPTION OF THE PREFERRED EMBODIMENTS

The following discussion of the preferred embodiments directed to a CMOS analog divider/multiplier/ratiometry circuit that is insensitive to process parameters and temperature variations is merely exemplary in nature, and in no way limits the invention or its applications or uses.

The following discussion of a CMOS analog divider/multiplier/ratiometry circuit according to the various embodiments of the invention will include a discussion of the initial design and mathematical analysis used to arrive at these embodiments. The designs and analysis will include some general assumptions that are well accepted in the industry. The first assumption is that the various MOS field effect transistor (FET) devices operate as square law devices in that the drain current of each FET device is the square function of the gate-source voltage of the FET device. A second assumption is that each FET device operates in the saturation region, and has an acceptable output impedance (length) for this purpose with acceptable noise immunity.

The design description and mathematical analysis used to arrive at the embodiments of the divider/multiplier/ratiometry circuit of the invention will be discussed for NMOS FET devices. However, the specific embodiments of the invention, and the practical implementation will include PMOS FET devices. This is because the known common fabrication processes for FET devices are N-well processes. In an N-well process, the NMOS FET devices are positioned on a substrate and the PMOS FET devices are positioned on a well, and thus the back gate terminals of the NMOS FET devices will be connected to ground. In this configuration, a PMOS FET has an isolated bulk or tank so that the bulk to source bias of those devices can be independently controlled, and thus can be made identical for better device performance. For NMOS FET devices fabricated by the N-well process, all of the bulk source voltages would not be identical. For a P-well fabrication process, the opposite will be true. Thus, either NMOS or PMOS devices will work, but the better performing device depends on the fabrication process as would be well understood in the art.

Figure 1:
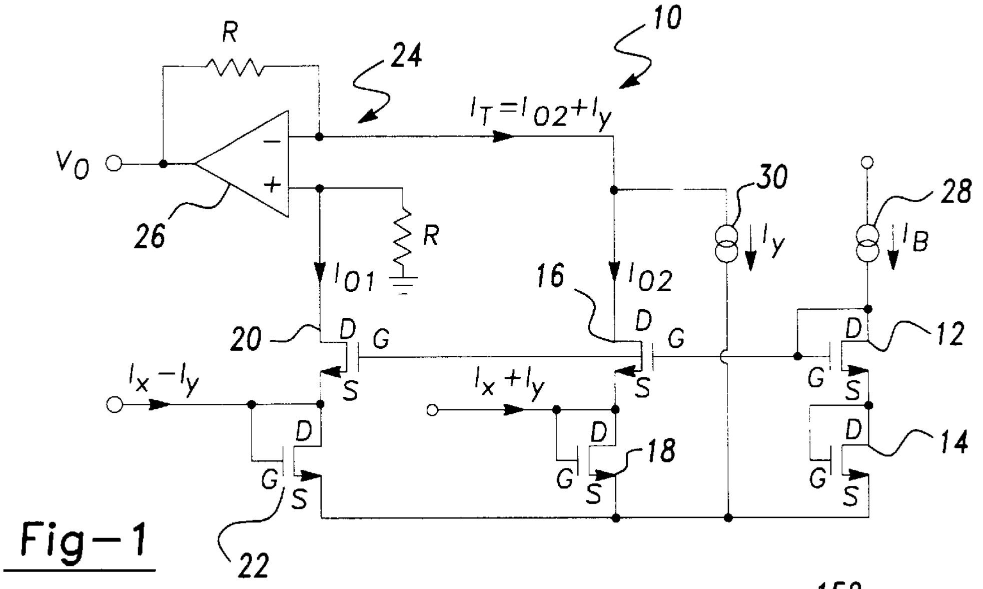
FIG. 1 is a schematic diagram showing a preliminary design of a voltage multiplier circuit that is process and temperature insensitive, according to an embodiment of the present invention.

FIG. 1 is an initial design of a multiplier circuit 10 according to the invention, that is insensitive to process parameters and temperature variations. The circuit 10 is made up of six NMOS FET devices 12, 14, 16, 18, 20 and 22 electrically connected as shown, and an operational amplifier circuit 24, including resistors R and a summing or difference amplifier 26. The amplifier 26 can be any type of amplifier suitable for the purposes described below, as would be well understood to those skilled in the art. The values of each of the resistors R is unimportant for the analysis below, and they can have any suitable value for a particular application, as would be well understood to those skilled in the art. The FET devices 12–22 make up the heart of the divider/multiplier/ratiometry circuit of the invention discussed below. Each of the source (S) terminals, the drain (D) terminals, and the gate (G) terminals are labeled accordingly for each of the FET devices 12–22. The multiplier circuit 10 further includes a first current source 28 generating a stable current $I_B$ and a second current source 30 generating a stable current $I_y$. The electrical configuration of the multiplier circuit 10 has the various current (I) designations as indicated in FIG. 1, and as will be described in more detail below.

As shown, the current $I_y$ from the current source 30 is applied to the source terminals of the FET devices 16, 18 and 22, and the current $I_B$ from the current source 28 is applied to the drain terminal of the FET device 12. The source terminal of the FET device 12 is connected to the drain terminal of the FET device 14, the source terminal of the FET device 16 is connected to the drain terminal of the FET device 18, and the source terminal of the FET device 20 is connected to the drain terminal of the FET device 22. Each of the gate terminals of the FET devices 12, 16 and 20 are connected to each other. The current $I_{01}$ from the drain terminal of the FET device 20 is applied to the positive terminal of the difference amplifier 26, and the current $I_{02}$ from the drain terminal of the FET device 16 and the current $I_y$ from the current source 30 are applied to the negative terminal of the difference amplifier 26.

The multiplier circuit 10 is a circuit that multiplies and provides a ratio of two input signals together, whether they are voltages or currents, and provides an output of this multiplication ratio. In the circuit 10, the input signals are $I_x - I_y$ applied to the gate and drain terminals of the FET device 22 and $I_x + I_y$ applied to the gate and drain terminals of the FET device 18. An output of the ratio of these input signals is found as $V_0$ at the output of the difference amplifier 26. The multiplication of two input signals to provide a product output has many applications, for example, mixing two frequency signals, or providing modulation or demodulation where information is imposed onto a high frequency carrier signal or information is stripped from a high frequency carrier signal, as is well understood in the art. For the example of the yaw rate control system, $I_x$ could be the current representation of the voltage from the vehicle power supply, and $I_y$ could be the current representation of the voltage from a temperature compensation circuit. What the multiplier circuit 10 of the invention accomplishes, is that it multiplies the two input signals, $I_y$ and $I_y$, currents in this example, to provide the product output $V_0$ without being influenced by temperature changes that effects the circuit components or other circuit parameter variations, i.e., is ratiometric. To show that $V_0$ does not include influencing factors from these parameters, a mathematical analysis of the circuit 10 is given below.

The divider/multiplier/ratiometry circuits that will be discussed below multiplies two voltage inputs together. However, as will be appreciated by those skilled in the art, the novel aspects of the invention can be used to multiply more than two signals together. These voltage inputs will be designated Vddk and VB(t). For the specific example of a yaw rate control system, Vddk is the voltage output of the vehicle power supply and VB(t) is an inverse temperature characteristic of the yaw sensor itself. Additionally, a constant reference voltage input, designated Vref, is a stable zero temperature coefficient provided by a bandgap circuit function that gives a temperature sensitivity of the control system so that no contribution of temperature is applied to the circuit. However, as will be appreciated by those skilled in the art, the three voltage input signals Vddk, VB(t) and Vref can be any suitable voltage inputs for a particular application depending on what the divider/multiplier/ratiometry circuit is being used for.

Based on the assumptions and designations above, $I_x$, $I_y$ and $I_B$ are defined as:

$$I_x = \frac{Vddk}{R} \tag{1}$$

$$I_y = \frac{VB(t)}{R} \tag{2}$$

$$I_B = \frac{Vref}{R} \tag{3}$$

where R is a known resistance.

The current I through any of the FET devices 12–22 is given as:

$$I = K(\mathrm{VGS} - \mathrm{VT})^2 \tag{4}$$

where, K is a constant;

VT is a threshold voltage at which the FET device begins conducting; and

VGS is the gate-source terminal voltage of the FET device.

From this, VGS is defined as:

$$\sqrt{\frac{I}{K}} + VT = VGS \tag{5}$$

A loop equation defined by the FET devices 12, 14, 16 and 18 is given by:

$$-\mathrm{VGS}_1 - \mathrm{VGS}_2 + \mathrm{VGS}_3 + \mathrm{VGS}_4 = 0 \tag{6}$$

where, $VGS_1$ is the gate-source terminal voltage of the FET device 12;

$VGS_2$ is the gate-source terminal voltage of the FET device 14;

$VGS_3$ is the gate-source terminal voltage of the FET device 16; and $VGS_4$ is the gate-source terminal voltage of the FET device 18.

Using the equations above, and solving the loop equation (6), $I_{02}$ can be found as follows. First convert the gate-source terminal voltages to currents.

$$-\sqrt{\frac{I_B}{K}} - \sqrt{\frac{I_B}{K}} + \sqrt{\frac{I_{02}}{K}} + \sqrt{\frac{I_{02} + I_x + I_y}{K}} = 0 \tag{7}$$

$$2\sqrt{I_B} = \sqrt{I_{02}} + \sqrt{I_{o2} + I_x + I_y} \tag{8}$$

Now solve for $I_{02}$.

$$4I_B = 2I_{02} + I_x + I_y + 2\sqrt{I_{02}(I_{02} + I_x + I_y)} \tag{9}$$

$$\text{let } I_{in_1} = I_x + I_y \tag{10}$$

$$(4I_B - 2I_{02} - I_{in_1})^2 = 4I_0^2 + 4I_{02}I_{in_1} \tag{11}$$

$$16I_B^2 + 4I_{02}^2 + I_{in_1}^2 - 16I_{02}I_B - 8I_{in_1}I_B + 4I_{in_1}I_{02} = 4I_0^2 + 4I_{02}I_{in_1} \tag{12}$$

$$16I_{02}I_B = I_{in_1}^2 - 8I_{in_1}I_B + 16I_B^2 \tag{13}$$

$$I_{02} = \frac{I_{in_1}^2}{16I_B} - \frac{I_{in_1}}{2} + I_B \tag{14}$$

$$I_T = I_{02} + I_y \tag{15}$$

Next, a loop equation defined by the FET devices 12, 14, 20 and 22 is given by:

$$-\mathrm{VGS}_1 - \mathrm{VGS}_2 + \mathrm{VGS}_5 + \mathrm{VGS}_6 = 0 \tag{16}$$

where $VGS_5$ is the gate-source terminal voltage of the FET device 20; and $VGS_6$ is the gate-source terminal voltage of the FET device 22.

Based on the equations above, $I_{01}$ can be determined as follows.

$$2\sqrt{I_B} = \sqrt{I_{01}} + \sqrt{I_{o1} + I_x - I_y} \tag{17}$$

$$\text{let } I_{in_2} = I_x - I_y \tag{18}$$

$$4I_B = 2I_{01} + I_{in_2} + 2\sqrt{I_{01}(I_{01} + I_{in_2})} \tag{19}$$

$$(4I_B - 2I_{01} - I_{in_2})^2 = 4I_{01}^2 + 4I_{01}I_{in_2}^2 \tag{20}$$

$$16I_B^2 + 4I_{01}^2 + I_{in_2}^2 - 16I_BI_{01} - 8I_BI_{in_2} + 4I_{01}I_{in_2} = 4I_{01}^2 + 4I_{01}I_{in_2}^2 \tag{21}$$

$$16I_BI_{01} = I_{in_2}^2 - 8I_{in_2}I_B + 16I_B^2 \tag{22}$$

$$I_{01} = \frac{I_{in2}^2}{16I_B} - \frac{I_{in2}}{2} + I_B \tag{23}$$

The current $I_T$ is applied to the negative terminal and the current $I_{01}$ is applied to the positive terminal of the difference amplifier 26. The current $I_{01}$ is given in equation (23) above. Using equation (14), and equations (24)–(27) below, solve for $I_T$.

$$I_T = I_{02} + I_y = \frac{(I_x + I_y)^2}{16I_B} - \frac{I_x}{2} - \frac{I_y}{2} + I_y + I_B \tag{24}$$

$$I_T = \frac{(I_x + I_y)^2}{16I_B} - \frac{I_x}{2} + \frac{I_y}{2} + I_B \tag{25}$$

-continued $$-4I_B \le I_{in} \le 4I_B \tag{26}$$

$$I_T = \frac{I_{01}R - V_0}{R} \tag{27}$$

Now solve for $V_0$ as follows.

$$V_0 = R(I_{01} - I_T) \tag{28}$$

$$V_0 = R\left[\frac{I_x^2 + I_y^2 - 2I_xI_y}{16I_B} - \frac{I_x}{2} + \frac{I_y}{2} + I_B - \frac{I_x^2 + I_y^2 + 2I_xI_y}{16I_B} + \frac{I_x}{2} - \frac{I_y}{2} - I_B\right] \tag{29}$$

$$V_0 = \frac{-4RI_xI_y}{16I_B} \tag{30}$$

Now substituting $$I_x = \frac{Vddk}{R},\ I_y = \frac{VB(t)}{R},\ \text{and}\ I_B = \frac{Vref}{R} \tag{31}$$

$$V_0 = \frac{-R\frac{VDD}{R}\frac{VB(t)}{R}}{4\frac{Vref}{R}} \tag{32}$$

$$V_0 = \frac{-Vddk\,VB(t)}{4Vref} \tag{33}$$

If the resistance R associated with Vref is one-half the other resistances, then:

$$V_0 = \frac{-Vddk\,VB(t)}{2Vref} \tag{34}$$

As is apparent, the final expression for $V_0$ does not include any resistor terms, and thus is not sensitive to temperature changes on the multiplier circuit 10. Therefore, it has been shown that the multiplier circuit 10 is temperature and process invariant and is ratiometric.

In an alternate version, the resistor connected to the positive terminal of the difference amplifier 26 can be divided by two, and a second resistor can be connected to the negative terminal of the difference amplifier 26 and ground. This version gives:

$$-I_1 + \frac{\frac{I_2R}{2}}{R} + \frac{\frac{I_2R}{2} - V_0}{R} = 0 \tag{35}$$

Figure 2:
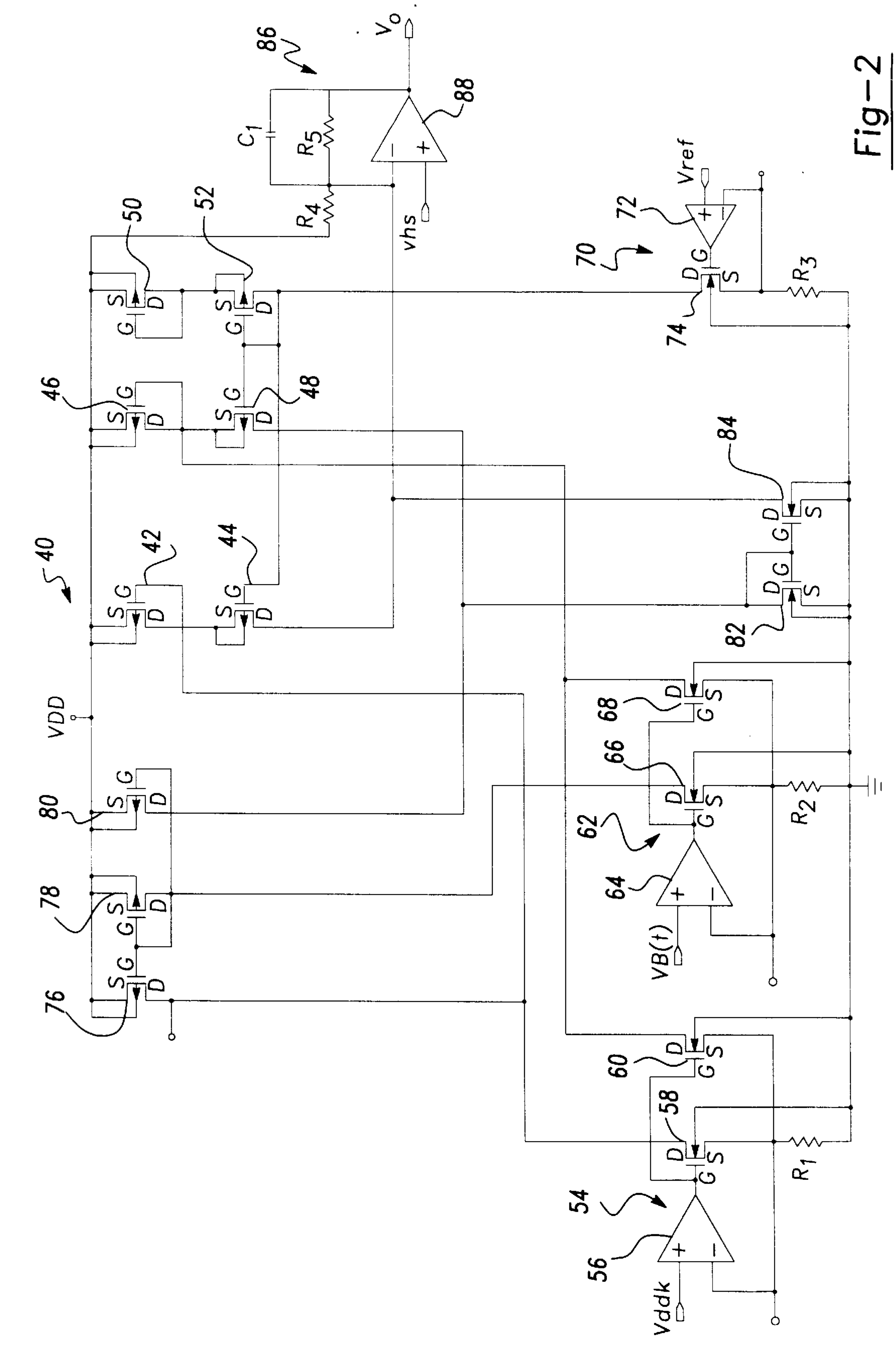
FIG. 2 is a schematic diagram of a CMOS analog divider/multiplier/ratiometry circuit that is insensitive to process parameters and temperature variations, according to an embodiment of the present invention, that incorporates the voltage multiplier circuit design of FIG. 1.

FIG. 2 is a schematic diagram of a CMOS analog divider/multiplier/ratiometry circuit 40 that incorporates the design features of the multiplier circuit 10, according to an embodiment of the present invention. A power supply voltage VDD is provided. The circuit 40 includes six PMOS FET devices 42, 44, 46, 48, 50 and 52 that make up the heart of the circuit 40, and are electrically connected together as shown in substantially the same manner as the FET devices 12, 14, 16, 18, 20 and 22, above. In this regard, the device 52 corresponds to the device 12, the device 50 corresponds to the device 14, the device 48 corresponds to the device 16, the device 46 corresponds to the device 18, the device 44 corresponds to the device 20 and the device 42 corresponds to the device 22. The resistor and capacitor values can be any value suitable for a particular application, as would be understood by those skilled in the art.

A first linear voltage-to-current converter input circuit 54, including an input operational amplifier 56 and NMOS FET devices 58 and 60, generates an input current through resistor $R_1$ that corresponds to the current $I_x$ above. The input voltage Vddk is applied to the positive terminal of the amplifier 56, and the output from the amplifier 56 is applied to the gate terminal of the FET device 58 and the gate terminal of the FET device 60. The source terminals of the FET devices 58 and 60 are connected to the resistor $R_1$ and the negative terminal of the amplifier 56.

A second linear voltage-to-current converter input circuit 62, including an input operational amplifier 64 and NMOS FET devices 66 and 68, generates an input current through resistor $R_2$ that corresponds to the current $I_y$ above. The input voltage VB(t) is applied to the positive terminal of the amplifier 64, and the output of the amplifier 64 is connected to the gate terminals of the FET devices 66 and 68. The source terminals of the devices 66 and 68 are connected to the resistor $R_2$ and the negative terminal of the amplifier 64.

A third linear voltage-to-current converter input circuit 70, including an input operational amplifier 72 and an NMOS FET device 74, generates an input current through resistor $R_3$ that corresponds to the current $I_B$ above. The input voltage Vref is applied to the positive terminal of the operational amplifier 72 and the output of the operational amplifier 72 is connected to the gate terminal of the device 74. The source terminal of the FET device 74 is connected to the resistor $R_3$ and the negative terminal of the amplifier 72.

Because $I_x-I_y$ and $I_x+I_y$ are inputs to the multiplier portion (devices 42–52) of the circuit 40, mirror currents of the currents $I_x$ and $I_y$ need to be provided. Therefore, FET devices acting as current sinks are incorporated in the circuit 40. Three PMOS FET devices 76, 78 and 80 and two NMOS FET devices 82 and 84 generate mirror currents of $I_x$ and $I_y$ to provide the $I_x-I_y$ and $I_x+I_y$ currents as inputs to the FET devices 42 and 46. The drain terminal of the FET device 58 is connected to the drain terminal of the FET device 76 and the gate terminal of the FET device 42. Additionally, the drain terminal of the FET device 66 is connected to the drain terminal of the FET device 78, and the gate terminals of the FET devices 76 and 78 are connected together. Because the current $I_y$ flows through the device 66 into the device 78 and is passed to the device 76 acting as a current source, and the current $I_x$ flows through the device 58, $I_x-I_y$ is applied to the gate terminal of the FET device 42. Further, both of the drain terminals of the FET devices 60 and 68 are connected to the gate terminal of the FET device 46. Therefore, because $I_x$ flows through the FET device 60 and $I_y$ flows through the FET device 68, $I_x+I_y$ is applied to the gate terminal of the device 46. The drain terminal of the FET device 66 is also mirrored to the FET device 80, and the drain terminal of the FET device 80 is connected to the drain and gate terminals of the FET device 82. Thus, $I_y$ is mirrored to the FET device 84, and summed with the current 102.

An operational amplifier circuit 86 including a difference amplifier 88 and resistors $R_4$ and $R_5$ corresponds to the operational amplifier 24 above. In the circuit 40, the positive terminal of the operational amplifier 88 is connected to a fixed reference potential vhs (VDD/2). The negative terminal of the amplifier 88 is connected to the drain terminal of the device 44 and the drain terminal of the device 84. In this configuration, the negative of $I_{01}$ is applied to the negative terminal of the amplifier 88. The fixed reference voltage vhs is used in the design of the circuit 40 to minimize the amplifier 88 input voltage range requirement. Thus $V_0$ provides an output that is the product of Vddk and VB(t), and is ratiometric in the same manner as discussed above for the multiplier circuit 10.

Figure 3:
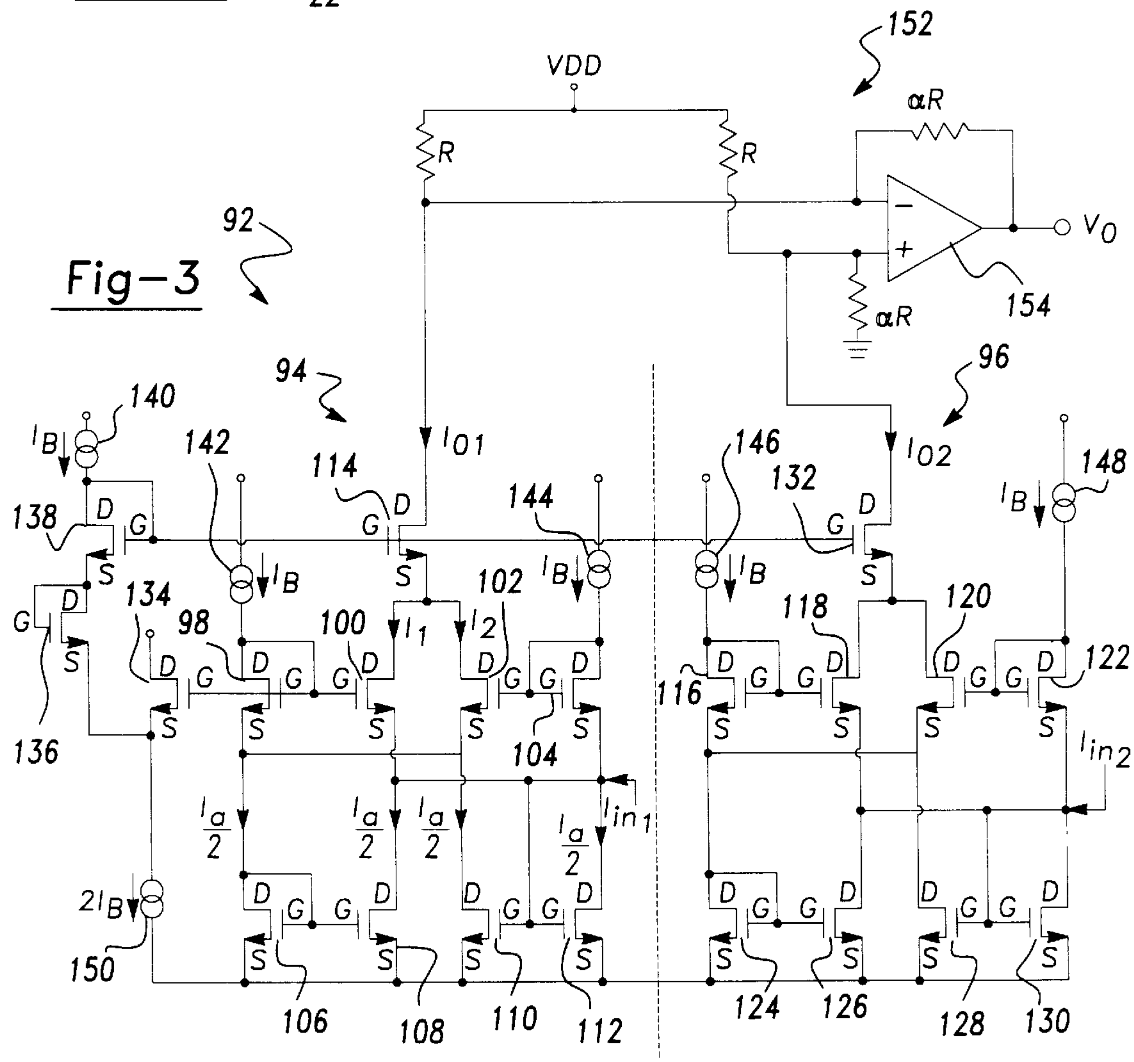
FIG. 3 is a schematic diagram showing another preliminary design of a voltage multiplier circuit that is process and temperature insensitive, according to another embodiment of the present invention.

FIG. 3 is a schematic diagram of a multiplier circuit 92, according to another embodiment of the present invention, that is more complicated (includes more transistors) than the multiplier circuit 10 discussed above, but operates in much the same way to multiply two input signals together in a manner that is temperature and process parameter insensitive. The multiplier circuit 92 is separated into a first cell 94 and a second cell 96. The first cell 94 includes NMOS FET devices 98, 100, 102, 104, 106, 108, 110, 112 and 114, and the second cell 96 includes NMOS FET devices 116, 118, 120, 122, 124, 126, 128, 130 and 132 that are electrically connected as shown in the same way. Further, NMOS FET devices 134, 136 and 138 are incorporated to provide a suitable gate bias to the devices 114 and 132. Current sources 140, 142, 144, 146, 148 and 150 provide a stable current $I_B$. The first cell 94 processes an input current $I_{in_1}$ applied to the gate terminals of the FET devices 110 and 112 and the source terminals of the FET devices 100 and 104, to generate an output current $I_{01}$ at the drain terminal of the FET device 114. Likewise, the second cell 96 processes an input current $I_{in_1}$ applied to the gate terminals of the FET devices 128 and 130 and the source terminals of the FET devices 118 and 122 to generate an output current 102 at the drain terminal of the FET device 132. Also included is an operational amplifier circuit 152, including a difference amplifier 154 and resistors R and αR, as shown. The current $I_{01}$ is applied to the negative terminal and the current 102 is applied to the positive terminal of a difference amplifier 148. As above, the output $V_0$ of the difference amplifier 154 is the product of the currents $I_{01}$ and $I_{02}$.

The combination of the sixteen FET devices 98–112 in the cell 94 and the FET devices 116–130 in the cell 96 make up the heart of the multiplier circuit 92 to provide the ratiometric product output of the input signals. The gate terminals of the FET devices 98 and 100 are connected together, the gate terminals of the FET devices 102 and 104 are connected together, the gate terminals of the FET devices 106 and 108 are connected together, and the gate terminals of the FET devices 110 and 112 are connected together. The source terminals of the FET devices 98 and 102 are connected together, the source terminals of the FET devices 100 and 104 are connected together, and the source terminals of the FET devices 106, 108, 110 and 112 are connected together. Additionally, the source terminal of the FET device 98 is connected to the drain and gate terminals of the FET device 106, the source terminal of the FET device 100 is connected to the drain terminal of the FET device 108, the source terminal of the FET device 102 is connected to the drain terminal of the FET device 110, and the source terminal of the FET device 104 is connected to the drain and gate terminals of the FET device 112. The source terminal of the FET device 114 is connected to the drain terminals of the FET devices 100 and 102.

The combination of the FET devices 106, 108, 110 and 112 are used to maintain the drain-source terminal voltages of each of the FET devices 98,100, 102 and 104 substantially the same so as to eliminate or reduce the effects of channel length modulation (λ), well known to those skilled in the art. The FET device 114 is provided to assure that the currents 11 and 12 applied to the drain terminals of the FET devices 100 and 102, respectively, are not corrupted, and are not effected by the drain-source terminal voltage of the device 114. The FET devices 134, 136 and 138 are used to provide the appropriate gate voltages to the FET devices 114 and 132 for this purpose. The gate terminal of the FET device 114 is connected to the drain and gate terminals of the FET device 138, the source terminal of the FET device 138 is connected to the gate and drain terminals of the FET device 136, the source terminal of the FET device 136, the source terminal of the FET device 136 is connected to the source terminal of the FET device 134, and the gate terminal of the FET device 134 is connected to the gate terminals of the FET devices 98 and 100 to provide this characteristic. The current source 140 is connected to the drain and gate terminals of the FET device 138, the current source 142 is connected to the drain and gate terminals of the FET device 98, the current source 144 is connected to the gate and drain terminals of the FET device 104, and the current source 142 is connected to the gate terminals of the FET devices 98 and 100.

The FET devices and current sources in the cell 96 are connected in the same way as the FET devices and current sources in the cell 94, and provide the same function to generate the output current 102 based on the input current $I_{in_1}$.

To show that the output $V_0$ is not influenced by temperature or process variances, a mathematical analysis can be shown as follows.

The various currents in the cell 94 can be defined as follows:

$$I_a=I_2+I_B \tag{36}$$

$$I_2+I_B=I_1+I_B+I_{in_1} \tag{37}$$

$$I_2=I_1+I_{in_1} \tag{38}$$

A loop equation defined by the FET devices 98, 100, 102 and 104 is given by:

$$-VGS_1+VGS_2+VGS_3-VGS_4=0 \tag{39}$$

where, VGS, is the gate-source terminal voltage of the FET device 98;

$VGS_2$ is the gate-source terminal voltage of the FET device 100;

$VGS_3$ is the gate-source terminal voltage of the FET device 102; and $VGS_4$ is the gate-source terminal voltage of the FET device 104.

The current through the FET device 98 is given by:

$$I_1=I_B=K(VGS_1-VT)^2(1+\lambda VDS_1) \tag{40}$$

where VDS is the drain-source terminal voltage of the FET device 98.

$$\sqrt{\frac{I_B}{K(1+\lambda VDS_1)}}+V_T=VGS_1 \tag{41}$$

Solving for the loop equation gives:

$$-\sqrt{\frac{I_B}{K(1+\lambda VDS_1)}}+\sqrt{\frac{I_1}{K(1+\lambda VDS_2)}}+\sqrt{\frac{I_2}{K(1+\lambda VDS_3)}}-\sqrt{\frac{I_B}{K(1+\lambda VDS_4)}}=0 \tag{42}$$

where $VDS_2$ is the drain-source terminal voltage of the FET device 100;

$VDS_3$ is the drain-source terminal voltage of the FET device 102; and $VDS_4$ is the drain-source terminal voltage of the FET device 104.

$$\text{Because } VDS_1=VDS_2=VDS_3=VDS_4 \tag{43}$$

We get:

$$2\sqrt{I_B} = \sqrt{I_1} + \sqrt{I_2} = \sqrt{I_1} + \sqrt{I_1 + I_{in_1}} \tag{44}$$

Solving for $I_1$.

$$4I_B = 2I_1 + I_{in_1} + 2\sqrt{I_1^2 + I_1 I_{in_1}} \tag{45}$$

$$(4I_B - 2I_1 - I_{in_1})^2 = 4I_1^2 + 4I_1 I_{in_1} \tag{46}$$

$$16I_B^2 + 4I_1^2 + I_{in_1}^2 - 16I_B I_1 - 8I_B I_{in_1} + 4I_1 I_{in_1} = 4I_1^2 + 4I_1 I_{in_1} \tag{47}$$

$$16I_B I_1 = I_{in_1}^2 - 8I_B I_{in_1} + 16I_B^2 \tag{48}$$

$$I_1 = \frac{I_{in_1}^2}{16I_B} - \frac{I_{in_1}}{2} + I_B \tag{49}$$

Because $I_2=I_1+I_{in_1}$, $$I_2 = \frac{I_{in_1}^2}{16I_B} + \frac{I_{in_1}}{2} + I_B \tag{50}$$

$$I_{01} = I_1 + I_2 = \frac{I_{in_1}^2}{8I_B} + 2I_B \tag{51}$$

$$\text{When } I_1 \to 0,\ I_{in_1}^2 - 8I_B I_{in_1} + 16I_B^2 = 0 \tag{52}$$

$$I_{in_1} = 4I_B \pm \sqrt{16I_B^2 - 16I_B^2} \tag{53}$$

$$I_{in_1} = 4I_B \tag{54}$$

$$-4I_B \le I_{in_1} \le 4I_B \tag{55}$$

$$\text{When } I_2 \to 0,\ I_{in_1}^2 + 8I_B I_{in_1} + 16I_B^2 = 0 \tag{56}$$

$$I_{in_1} = -4I_B \pm \sqrt{16I_B^2 - 16I_B^2} \tag{57}$$

$$I_{in_1} = -4I_B \tag{58}$$

Because the loop equation defined by the FET devices 98, 100, 102 and 104 is the same as the loop equation defined by the FET devices 116, 118, 120, and 122, 102 can be represented as follows:

$$I_{02} = \frac{I_{in_2}^2}{8I_B} + 2I_B \tag{59}$$

Next, ΔI is defined as:

$$\Delta I_0 = I_{01} - I_{02} = \frac{1}{8I_B}\left(I_{in_1}^2 - I_{in_2}^2\right) \tag{60}$$

As above, let:

$$I_{in_1} = I_x + I_y; \tag{61}$$

$$I_{in_2} = I_x - I_y; \tag{62}$$

-continued $$I_x = \frac{Vddk}{R}; \tag{63}$$

$$I_y = \frac{VB(t)}{R}; \text{ and} \tag{64}$$

$$I_B = \frac{Vref}{R} \tag{65}$$

$$\text{Then, } \Delta I_0 = \frac{1}{8I_B}(I_x^2 + I_y^2 + 2I_x I_y - I_x^2 - I_y^2 + 2I_x I_y) \tag{66}$$

$$\Delta I_0 = \frac{I_x I_y}{2I_B} \tag{67}$$

$$\Delta I_0 = \frac{\frac{Vddk}{R}\frac{VB(t)}{R}}{2\frac{Vref}{R}} \tag{68}$$

$$\Delta I_0 = \frac{Vddk \cdot VB(t)}{2RVref} \tag{69}$$

To carry on the mathematical analysis further to show that the $V_0$ is independent of temperature variances on the multiplier circuit 92, $V_0$ can be defined as follows:

$$V_0 = \Delta I_o(\alpha R) = \frac{\alpha Vddk \cdot VB(t)}{2Vref} \tag{70}$$

$$V_0 = \alpha R(I_{01} - I_{02}) \tag{71}$$

The voltage ($V_1$) applied to the positive terminal of the difference amplifier 154 is determined to get the voltage potential applied to the negative terminal of the difference amplifier 154.

$$V_1 = \frac{\alpha Vddk - \alpha R I_{o2}}{\alpha + 1} \tag{72}$$

Figure 4:
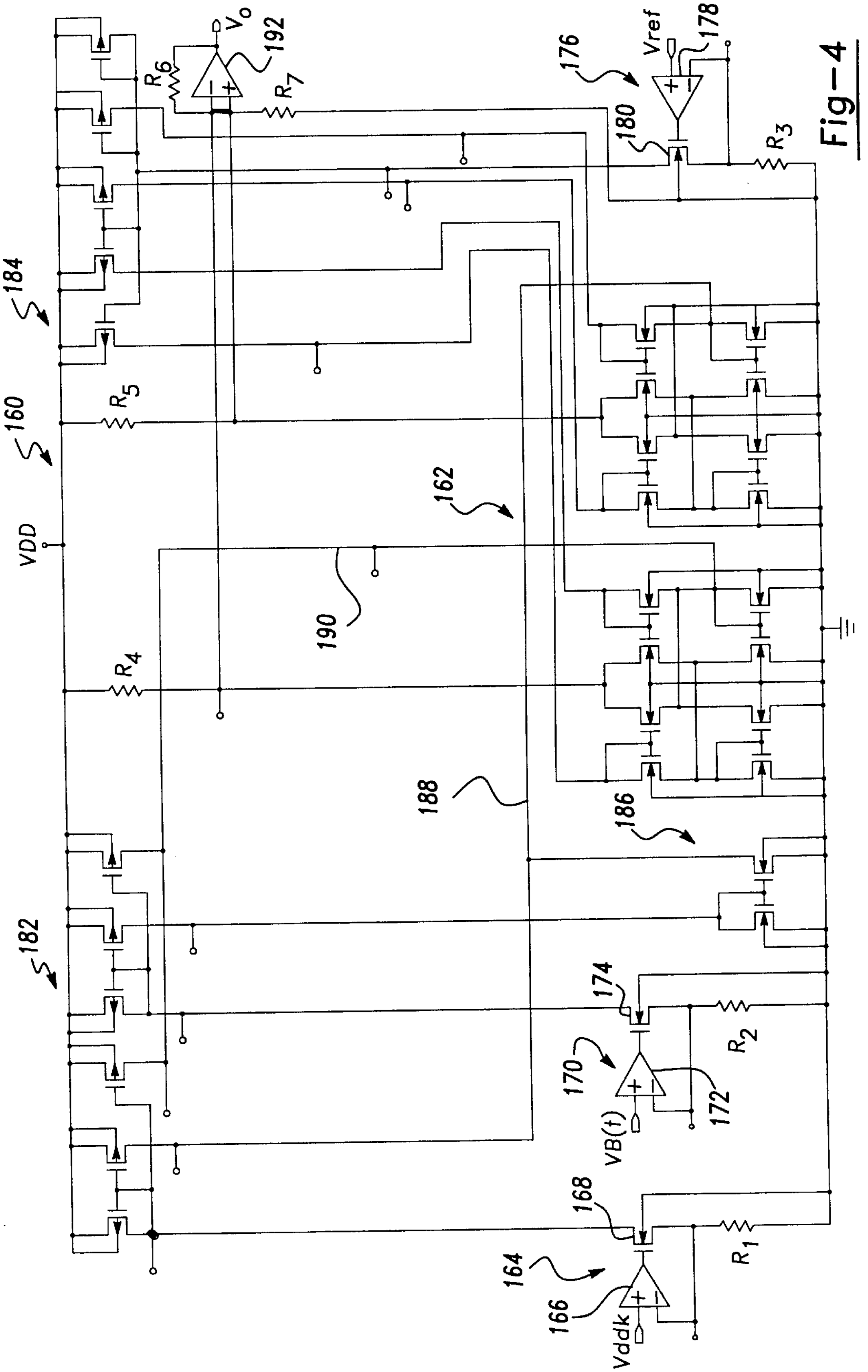
FIG. 4 is a schematic diagram of a CMOS analog divider/multiplier/ratiometry circuit, according to another embodiment of the present invention, that is insensitive to process parameters and temperature variations, that incorporates the voltage multiplier circuit design of FIG. 3.

FIG. 4 shows a schematic diagram of another CMOS analog divider/multiplier/ratiometry circuit 160 incorporating the design of the multiplier circuit 92, according to another embodiment of the invention. A cell of sixteen NMOS FET devices 162 correspond to the FET devices 98, 100, 102, 104, 106, 108, 110, 112, 116, 118, 120, 122, 124, 126, 128 and 130, and are electrically connected in substantially the same manner. The circuit 160 includes a first linear voltage-to-current converter input circuit 164 including operational amplifier 166 and NMOS FET 168. The input voltage Vddk is applied to the positive terminal of the amplifier 166, and the output of the amplifier 166 is connected to the gate terminal of the device 168. The first input current $I_x$ is generated through resistor $R_1$. A second linear voltage-to-current converter input circuit 170 includes an operational amplifier 172 and NMOS FET device 174. The input voltage VB(t) is applied to the positive terminal of the amplifier 172, and the output of the amplifier 172 is applied to the gate terminal of the device 174. The second input current $I_y$ is generated through the resistor $R_2$. A third linear voltage-to-current converter input circuit 176 includes an operational amplifier 178 and a NMOS FET device 180. The input reference voltage Vref is applied to the positive terminal of the amplifier 178, and the output of the amplifier 178 is connected to the gate terminal of the device 180. The third input current $I_B$ is generated through the resistor $R_3$. A set of six PMOS FET devices 182, a set of five PMOS FET devices 184 and a set of two NMOS FET devices 186 are electrically connected as shown to provide mirror currents of $I_x$ and $I_y$. The input current $I_{in_1}$ $(I_x-I_y)$ is provided on line 188 and the input current $I_{in_1}$ is provided on line 190. The currents $I_{01}$ and $I_{02}$ are applied to the positive and negative terminals of a difference amplifier 192 to generate the output $V_0$ that is ratiometric, as discussed above.

Figure 5:
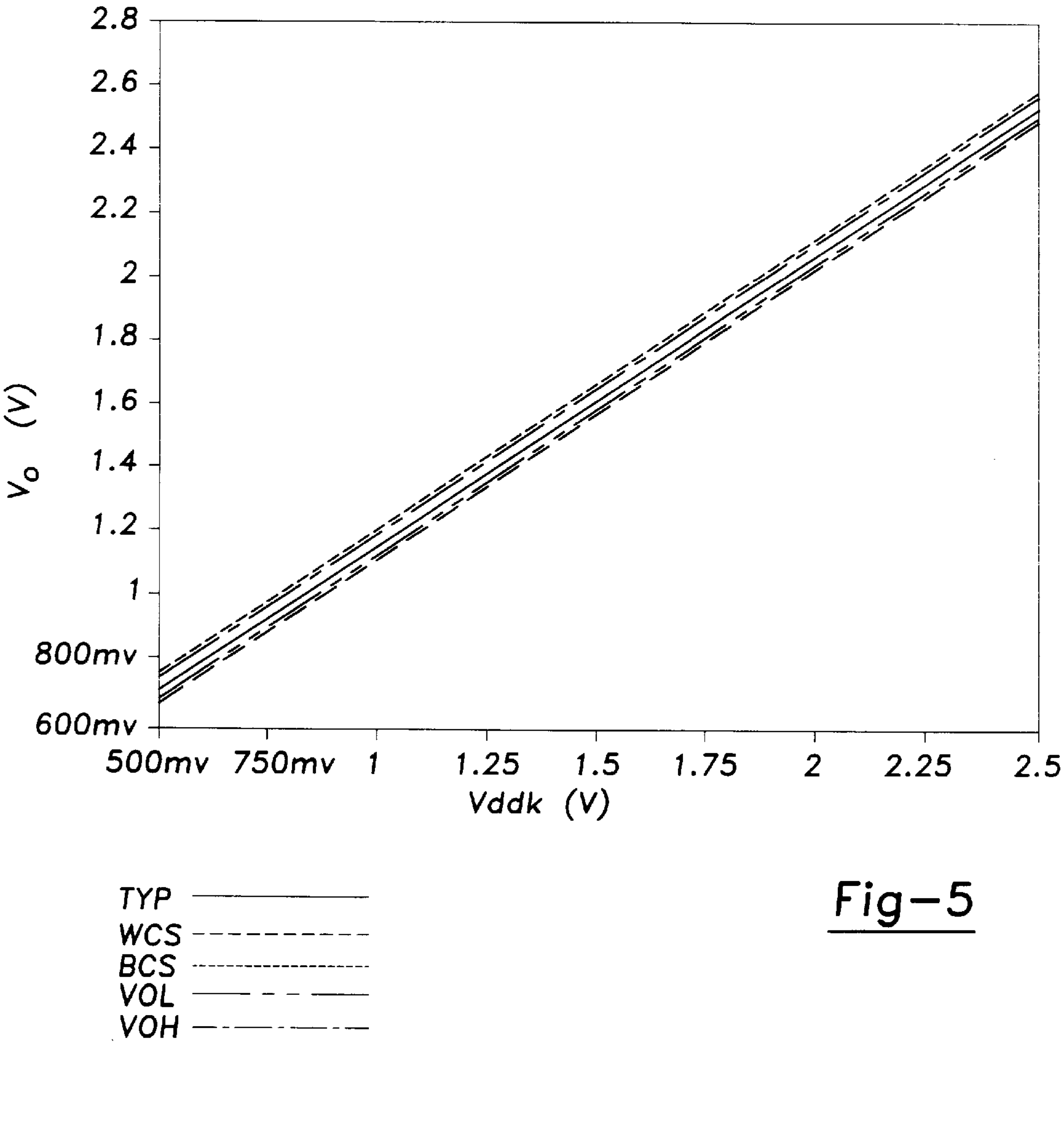
FIG. 5 is a graph of a DC transfer curve at T=−40° C. for the circuit shown in FIG. 2, depicting $V_0$ on the vertical axis and Vddk on the horizontal axis, for each of a typical case, worst case scenario, best case scenario, and process parameter variable low and process variable parameter high cases.
Figure 6:
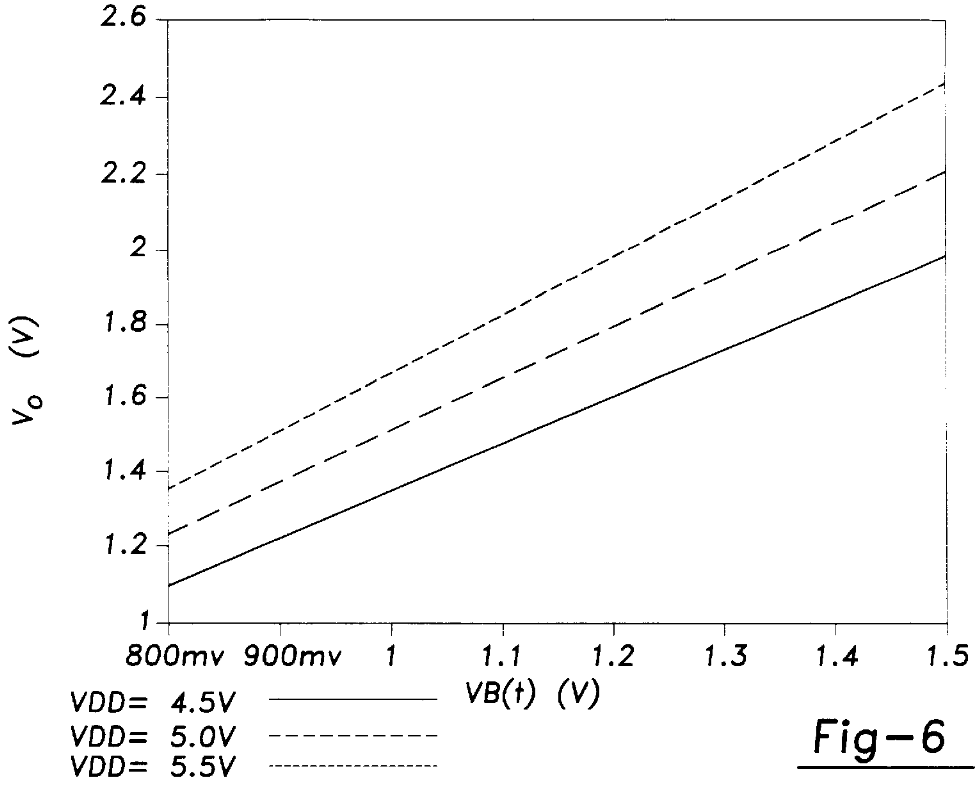
FIG. 6 is a graph of a DC transfer curve for the circuit shown in FIG. 2 depicting $V_0$ on the vertical axis and VB(t) on the horizontal axis, for each of VDD=4.5V, 5.0V and 5.5V.
Figure 7:
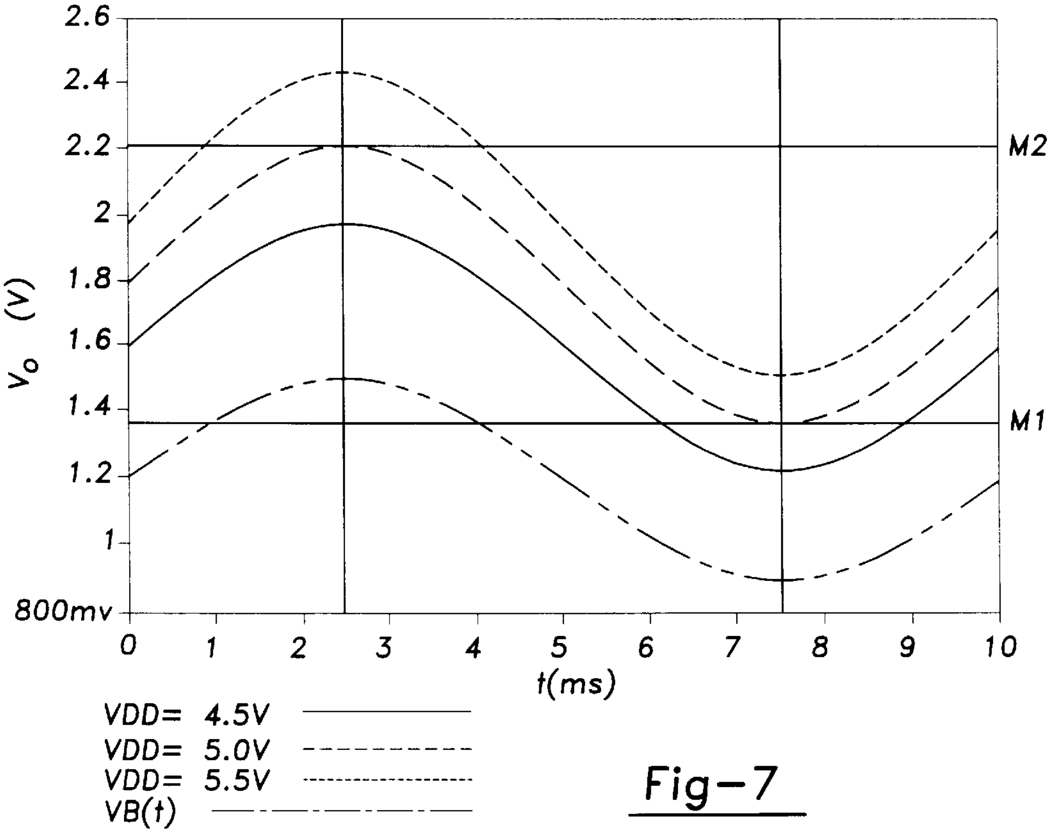
FIG. 7 is a graph of multiplier gain for the circuit shown in FIG. 2 at T=27° C. where $V_0$ is on the vertical axis and VB(t) is on the horizontal axis for VDD=4.5V, 5.0V and 5.5V, and VB(t) equal to 0.6v peak to peak.

Graphical representations of simulations based on the circuit 40 are provided. FIG. 5 is a graph showing DC transfer curves at temperature T=−40° C. where $V_0$ in volts is given on the vertical axis and Vddk in volts is given on the horizontal axis. The input voltages VB(t) and Vref remain constant. Five graph lines are shown, one for each of a typical (TYP) case, a worst case scenario (WCS), a best case scenario (BCS), a process parameter variable low (VOL) case, and a process parameter variable high (VOH) case. FIG. 6 is a graph showing transfer curves where $V_0$ in volts is given on the vertical axis and VB(t) in volts is given on the horizontal axis, where Vddk and Vref remain constant. Three graph lines are shown, one for each of VDD equal to 4.5 volts, 5.0 volts and 5.5 volts. This graph is intended to show that the output $V_0$ is in fact ratiometric. FIG. 7 shows a graph of the multiplier gain for changes in the supply voltage VDD, where $V_0$ in volts is given on the vertical axis and time in milliseconds is given on the horizontal axis. A sine wave curve is shown for the power supply voltages VDD of 4.5V, 5.0V and 5.5V, where VB(t) equals 0.6V peak to peak, for a temperature of 27° C.

Figure 8:
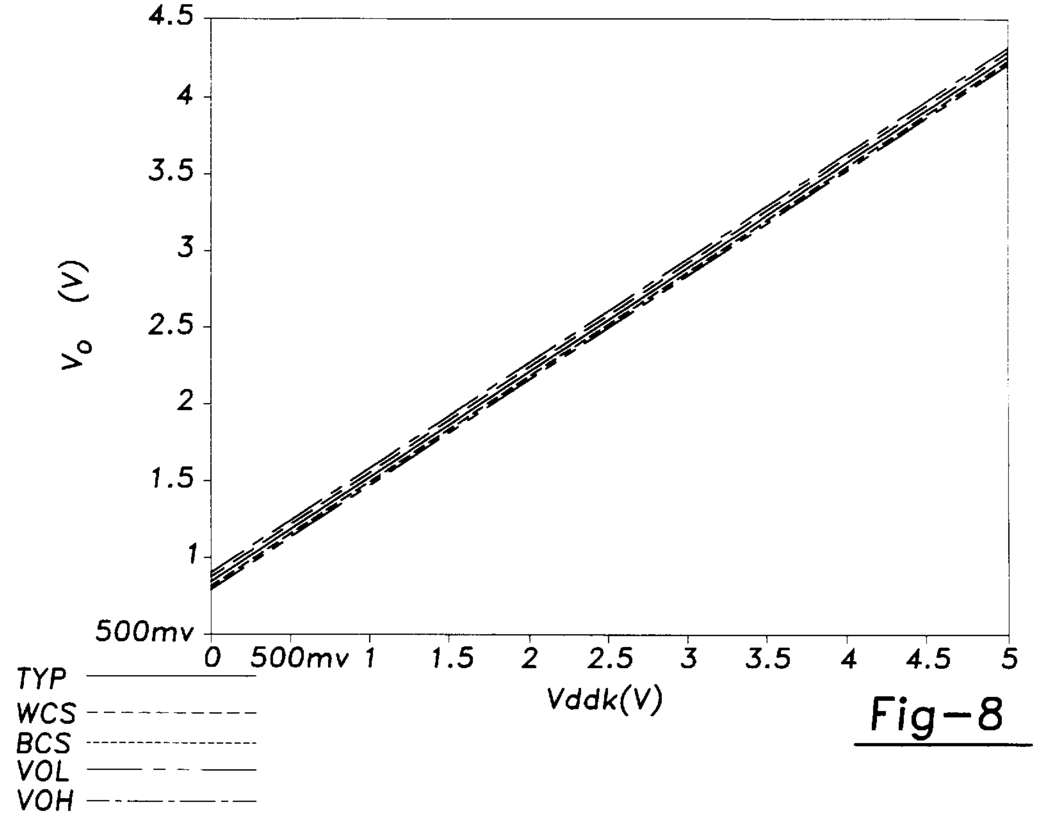
FIG. 8 is a graph of the DC transfer curve at T=−40° C. for the circuit shown in FIG. 4, where $V_0$ is on the vertical axis and Vddk is on the horizontal axis for each of a typical case, a worse case scenario, a best case scenario, and process parameter variable low and high cases.
Figure 9:
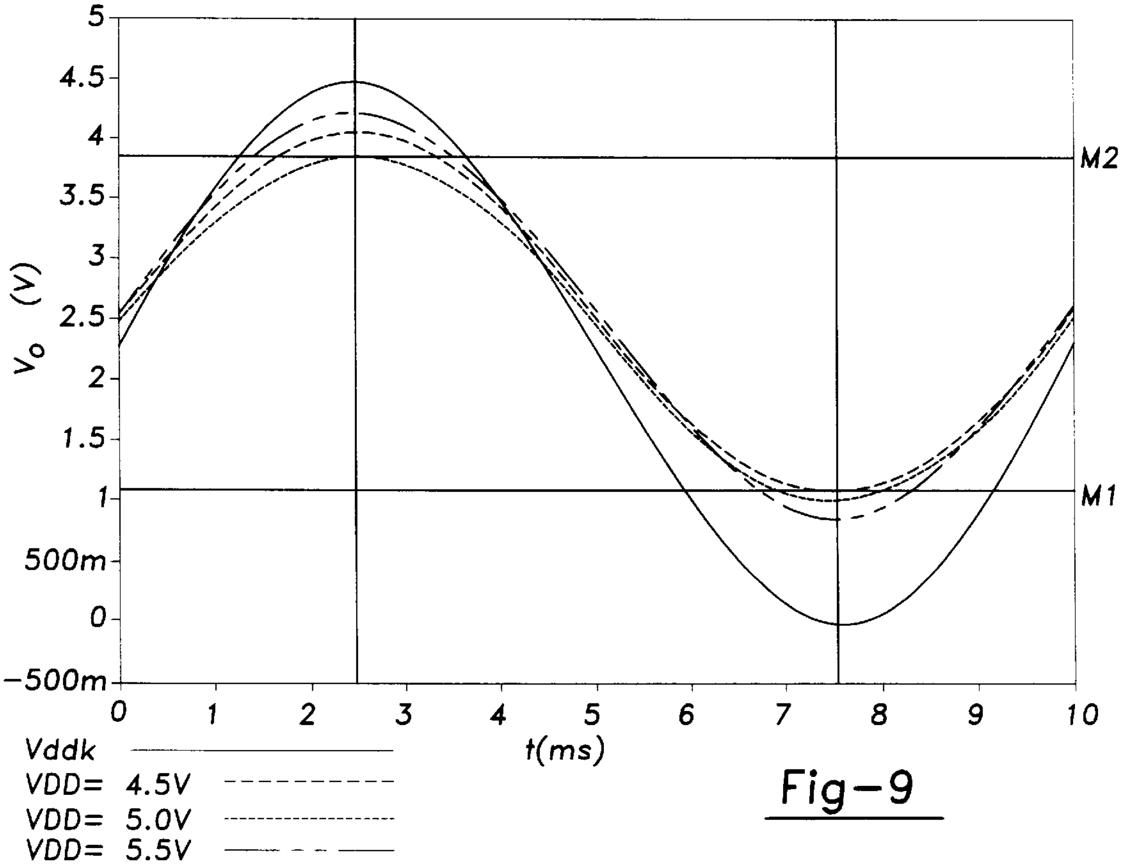
FIG. 9 is a graph of multiplier gain for the circuit shown in FIG. 4, where $V_0$ is on the vertical axis and time is on the horizontal axis, for VDD=4.5V, 5.0V and 5.5V, and Vddk equal to 4.5V peak to peak.

Additionally, graphical representations of simulations made on the circuit 160 are provided. FIG. 8 is a graph showing DC transfer curves at temperature T=−40° C., where $V_0$ in volts is given on the vertical axis and Vddk in volts is given on the horizontal axis. The input voltages VB(t) and Vref remain constant. Five graph lines are given, one for each of a typical (TYP) case, a worst case scenario (WCS), a best case scenario (BCS), a process parameter variable low (VOL) case, and a process parameter variable high (VOH) case. FIG. 9 is a graph of the multiplier gain for changes in the supply voltage VDD, where $V_0$ in volts is given on the vertical axis and time in milliseconds is given on the horizontal axis. A sine wave curve is shown for the power supply voltages VDD of 4.5V, 5.0V and 5.5V, where Vddk=4.5V peak to peak for a temperature of 27° C. FIG. 10 shows a graph of the output drift with temperature for the output $V_0$ of the circuit 160 for the typical, worst case scenario, best case scenario, process parameter variable low and process parameter variable high cases, showing $V_0$ in volts on the vertical axis and temperature in degrees Celsius on the horizontal axis. FIG. 11 is a graph of the measured output voltage $V_0$ of the circuit 160 with $V_0$ on the vertical axis and Vddk in program counts on the horizontal axis.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

The embodiments of the invention in which an exclusive property or privilege is claimed are defined as follows:

1. A multiplier circuit for providing a ratio/product of two or more inputs, said circuit comprising:

a first field effect transistor (FET) (18) including a gate terminal, a source terminal and a drain terminal, said first FET acting as a first input FET wherein a first input signal is applied to the gate terminal of the first FET;

a second FET (22) including a gate terminal, a source terminal and a drain terminal, said second FET acting as a second input FET wherein a second input signal is applied to the gate terminal of the second FET; and a plurality of other FETs each including a gate terminal, a source terminal and a drain terminal, wherein the first FET, the second FET and the plurality of other FETs are all electrically connected in a manner effective to process the first input signal and the second input signal and provide a first multiplier signal and a second multiplier signal that are independent of process parameter and temperature variations on the multiplier circuit, said multiplier circuit being used in association with a vehicle yaw sensor system.

2. The multiplier circuit according to claim 1 further comprising a difference amplifier that is responsive to the first multiplier signal and the second multiplier signal, said difference amplifier providing an output signal that is a ratiometric/product of the first input signal and the second input signal.

3. The multiplier circuit according to claim 1 wherein the plurality of other FETs includes a third FET (12), a fourth FET (14), a fifth FET (16), and a sixth FET (20), wherein the first, second, third, fourth, fifth and sixth FETs are electrically connected to provide the first and second multiplier outputs.

4. The multiplier circuit according to claim 3 wherein the gate terminals of the first, third and sixth FETs are connected, the source terminal of the third FET (12) is connected to the gate and drain terminals of the fourth FET (14), the source terminal of the fifth FET (16) is connected to the drain and gate terminals of the first FET (18) and the first input signal, the source terminal of the sixth FET (20) is connected to the drain and gate terminals of the second FET (22) and the second input signal, and wherein the first multiplier signal is provided at the drain terminal of the fifth FET (16) and the second multiplier signal is provided at the drain terminal of the sixth FET (20).

5. The multiplier circuit according to claim 1 wherein the plurality of FETs includes a third, fourth, fifth, sixth, seventh, eighth, ninth, tenth, eleventh, twelfth, thirteenth, fourteenth, fifteenth and sixteenth FET, wherein the first, third, fourth, fifth, sixth, seventh, eighth and ninth FETs make up a first cell and the second, tenth, eleventh, twelfth, thirteenth, fourteenth, fifteenth and sixteenth FETs make up a second cell, said first cell generating the first multiplier signal and said second cell generating the second multiplier signal.

6. The multiplier circuit according to claim 5 wherein the gate terminal of the third FET (98) is connected to the gate terminal of the fourth FET (100); the gate terminal of the fifth FET (102) is connected to the gate terminal of the sixth FET (104); the gate terminal of the seventh FET (106) is connected to the gate terminal of the eighth FET (108); the gate terminal of the ninth FET (110) is connected to the gate terminal of the first FET (112); the source terminal of the third FET (98) is connected to the drain terminal and the gate terminal of the seventh FET (106), the source terminal of the fifth FET (102) and the drain terminal of the ninth FET (110); and the source terminal of the sixth FET (104) is connected to the drain and gate terminals of the first FET (112), the source terminal of the fourth FET (100) and the drain terminal of the eighth FET (108).

7. The multiplier circuit according to claim 5 wherein the gate terminal of the tenth FET (116) is connected to the gate terminal of the eleventh FET (118); the gate terminal of the twelfth FET (120) is connected to the gate terminal of the thirteenth FET (122); the gate terminal of the fourteenth FET (124) is connected to the gate terminal of the fifteenth FET (126); the gate terminal of the sixteenth FET (128) is connected to the gate terminal of the second FET (130); the source terminal of the tenth FET (116) is connected to the drain terminal and the gate terminal of the fourteenth FET (124), the source terminal of the twelfth FET (120) and the drain terminal of the sixteenth FET (128); and the source terminal of the thirteenth FET (122) is connected to the drain and gate terminals of the second FET (130), the source terminal of the eleventh FET (118) and the drain terminal of the fifteenth FET (126).

8. A multiplier circuit for providing a ratio/product of two or more inputs, said circuit comprising:

a first field effect transistor (FET) including a gate terminal, a source terminal and a drain terminal, said first FET acting as a first input FET wherein a first input signal is applied to the gate terminal of the first FET;

a second FET including a gate terminal, a source terminal and a drain terminal, said second FET acting as a second input FET wherein a second input signal is applied to the gate terminal of the second FET; and a third FET, a fourth FET, a fifth FET, a sixth FET, a seventh FET, an eighth FET, a ninth FET, a tenth FET, an eleventh FET, a twelfth FET, a thirteenth FET, a fourteenth FET, a fifteenth FET and a sixteenth FET each including a gate terminal, a source terminal and a drain terminal, wherein the first, second, third, fourth, fifth, sixth, seventh, eighth, ninth, tenth, eleventh, twelfth, thirteenth, fourteenth, fifteenth and sixteenth FETs are all electrically connected in a manner effective to process the first input signal and the second input signal and provide a first multiplier signal and a second multiplier signal that are independent of process parameter and temperature variations on the multiplier circuit, and wherein the first, third, fourth, fifth, sixth, seventh, eighth and ninth FETs make up a first cell that generates the first multiplier signal and the second, tenth, eleventh, twelfth, thirteenth, fourteenth, fifteenth and sixteenth FETs make up a second cell that generates the second multiplier signal.

9. An analog divider/multiplier/ratiometry circuit for generating a ratiometric output of two or more inputs, said circuit comprising:

a first input circuit responsive to a first input voltage, said first input circuit generating a first input current based on the first input voltage;

a second input circuit responsive to a second input voltage, said second input circuit generating a second input current based on the second input voltage;

a multiplier circuit, said multiplier circuit including a first field effect transistor (FET) (18), a second FET (22), and a plurality of other FETs each including a gate terminal, a source terminal and a drain terminal, said first FET acting as an input FET wherein a first multiplier input signal is applied to the gate terminal of the first FET and a second multiplier input signal is applied to the gate terminal of the second FET, both the first and second multiplier input signals being based on the first and second input current signals, and wherein the first FET, the second FET and the plurality of other FETs are all electrically connected in a manner effective to process the first and second multiplier input signals and provide a first multiplier output signal and a second multiplier output signal that are independent of process parameter and temperature variations on the divider/multiplier/ratiometry circuit; and a difference amplifier that is responsive to the first and second multiplier output signals, said difference amplifier providing an output that it is a ratio/product of the first and second input voltages.

10. The circuit according to claim 9 wherein the first input circuit is a first voltage-to-current converter input circuit including a first operational amplifier and a third FET (58) and the second input circuit is a second voltage-to-current converter input circuit including a second operational amplifier and a fourth FET (66), said first operational amplifier being responsive to the first input voltage and said second operational amplifier being responsive to the second input voltage, wherein the first current input flows through the third FET and the second current input flows through the fourth FET.

11. The circuit according to claim 10 further comprising a third voltage-to-current converter input circuit including a third operational amplifier and a fifth FET (74), said third operational amplifier being responsive to a constant input reference voltage, said third input circuit generating a reference current flowing through the fifth FET that is applied to the multiplier circuit.

12. The circuit according to claim 9 wherein the plurality of other FETs includes a third FET (12), a fourth FET (14), a fifth FET (16), and a sixth FET (20), wherein the first, second, third, fourth, fifth and sixth FETs are electrically connected to provide the first and second multiplier outputs.

13. The circuit according to claim 12 wherein the gate terminals of the first, third and sixth FETs are connected, the source terminal of the third FET (12) is connected to the gate and drain terminals of the fourth FET (14), the source terminal of the fifth FET (16) is connected to the drain and gate terminals of the first FET (18) and the first input signal, the source terminal of the sixth FET (20) is connected to the drain and gate terminals of the second FET (22) and the second input signal, and wherein the first multiplier signal is provided at the drain terminal of the fifth FET (16) and the second multiplier signal is provided at the drain terminal of the sixth FET (20).

14. The multiplier circuit according to claim 9 wherein the plurality of FETs includes a third, fourth, fifth, sixth, seventh, eighth, ninth, tenth, eleventh, twelfth, thirteenth, fourteenth, fifteenth and sixteenth FET, wherein the first, third, fourth, fifth, sixth, seventh, eighth and ninth FETs make up a first cell and the second, tenth, eleventh, twelfth, thirteenth, fourteenth, fifteenth and sixteenth FETs make up a second cell, said first cell generating the first multiplier signal and said second cell generating the second multiplier signal.

15. The circuit according to claim 14 wherein the gate terminal of the third FET (98) is connected to the gate terminal of the fourth FET (100); the gate terminal of the fifth FET (102) is connected to the gate terminal of the sixth FET (104); the gate terminal of the seventh FET (106) is connected to the gate terminal of the eighth FET (108); the gate terminal of the ninth FET (110) is connected to the gate terminal of the first FET (112); the source terminal of the third FET (98) is connected to the drain terminal and the gate terminal of the seventh FET (106), the source terminal of the fifth FET (102) and the drain terminal of the ninth FET (110); and the source terminal of the sixth FET (104) is connected to the drain and gate terminals of the first FET (112), the source terminal of the fourth FET (100) and the drain terminal of the eighth FET (108).

16. The circuit according to claim 14 wherein the gate terminal of the tenth FET (116) is connected to the gate terminal of the eleventh FET (118); the gate terminal of the twelfth FET (120) is connected to the gate terminal of the thirteenth FET (122); the gate terminal of the fourteenth FET (124) is connected to the gate terminal of the fifteenth FET (126); the gate terminal of the sixteenth FET (128) is connected to the gate terminal of the second FET (130); the source terminal of the tenth FET (116) is connected to the drain terminal and the gate terminal of the fourteenth FET (124), the source terminal of the twelfth FET (120) and the drain terminal of the sixteenth FET (128); and the source terminal of the thirteenth FET (122) is connected to the drain and gate terminals of the second FET (130), the source terminal of the eleventh FET (118) and the drain terminal of the fifteenth FET (126).

17. The circuit according to claim 9 wherein the multiplier circuit is used in association with a vehicle yaw rate sensor system.

18. A multiplier circuit for providing a ratio/product output of two or more inputs, said circuit comprising:

a plurality of field effect transistors (FETs), each including a gate terminal, a source terminal and a drain terminal, all of the FETs being either all NMOS FETs or all PMOS FETs, said plurality of FETs being responsive to a first input signal applied to the gate terminal of one of the FETs and a second input signal applied to the gate terminal of another one of the FETs, wherein the plurality of FETs are electrically connected in a manner effective to process the first input signal and the second input signal and provide a first multiplier signal and a second multiplier signal that are independent of process parameter and temperature variations on the multiplier circuit; and an amplifier that is responsive to the first multiplier signal and the second multiplier signal, said amplifier providing an output signal that is a ratiometric product of the first input signal and the second input signal.

19. The multiplier circuit according to claim 18 wherein the plurality of FETs is only six FETs electrically connected to provide the first and second multiplier signals.

20. The multiplier circuit according to claim 19 wherein the six FETs include a first FET (18), a second FET (22), a third FET (12), a fourth FET (14), a fifth FET (16) and a sixth FET (20), wherein the first FET (18) acts as a first input FET where the first input signal is applied to the gate terminal of the first FET (18) and the second FET (22) acts as a second input FET where the second input signal is applied to the gate terminal of the second FET (22), and wherein the gate terminals of the first, third and sixth FETs are connected, the source terminal of the third FET (12) is connected to the gate and drain terminals of the fourth FET (14), the source terminal of the fifth FET (16) is connected to the drain and gate terminals of the first FET (18) and the first input signal, the source terminal of the sixth FET (20) is connected to the drain and gate terminals of the second FET (22) and the second input signal, and wherein the first multiplier signal is provided at the drain terminal of the fifth FET (16) and the second multiplier signal is provided at the drain terminal of the sixth FET (20).

21. A multiplier circuit for providing a ratio/product of two or more inputs, said circuit comprising:

a first field effect transistor (FET) including a gate terminal, a source terminal and a drain terminal, said first FET acting as a first input FET wherein a first input signal is applied to the gate terminal of the first FET;

a second FET including a gate terminal, a source terminal and a drain terminal, said second FET acting as a second input FET wherein a second input signal is applied to the gate terminal of the second FET; and a third FET, a fourth FET, a fifth FET and a sixth FET each including a gate terminal, a source terminal and a drain terminal, wherein the first, second, third, fourth, fifth and sixth FETs are all electrically connected in a manner effective to process the first input signal and the second input signal and provide a first multiplier signal and a second multiplier signal that are independent of process parameter and temperature variations on the multiplier circuit.

* * * * *